United States Patent [19]
Kwon et al.

[11] Patent Number: 5,949,721
[45] Date of Patent: Sep. 7, 1999

[54] DATA OUTPUT RELATED CIRCUIT WHICH IS SUITABLE FOR SEMICONDUCTOR MEMORY DEVICE FOR HIGH-SPEED OPERATION

[75] Inventors: Kook-Hwan Kwon, Suwon; Hee-Choul Park, Seonnam, both of Rep. of Korea

[73] Assignee: Samsung Electronic, Co., Ltd., Suwon, Rep. of Korea

[21] Appl. No.: 09/000,720

[22] Filed: Dec. 30, 1997

[30] Foreign Application Priority Data

Dec. 30, 1996 [KR]  Rep. of Korea ...................... 96-76766

[51] Int. Cl.$^6$ ..................................................... G11C 15/00
[52] U.S. Cl. ................................ 365/189.11; 365/189.05; 365/196; 365/205; 365/189.01
[58] Field of Search .......................... 365/189.01, 230.01, 365/189.05, 196, 205, 203

[56] References Cited

U.S. PATENT DOCUMENTS

| | | | |
|---|---|---|---|
| 5,566,108 | 10/1996 | Kitamura et al. | 365/233 |
| 5,631,871 | 5/1997 | Park et al. | 365/203 |
| 5,644,548 | 7/1997 | Kitsukama et al. | 365/230.06 |
| 5,703,522 | 12/1997 | Arimoto et al. | 327/534 |
| 5,751,635 | 5/1998 | Wong et al. | 365/185.19 |
| 5,781,466 | 7/1998 | Tanaka et al. | 365/49 |

*Primary Examiner*—Viet Q. Nguyen
*Attorney, Agent, or Firm*—Marger Johnson & McCollom, P.C.

[57] ABSTRACT

A high-speed data output related circuit for a memory device reduces the operational cycle time by self-latching data in a data output buffer and self-resetting a main sense amplifier and level shifter, thereby the need for external control signals. A data output related circuit in accordance with the present invention includes: a sense amplifier for generating sensed data; a level shifter for converting the level of the sensed data, thereby generating level shifted data; a data output buffer for self-latching the level shifted data in first latch nodes in response to the level shifted data, for latching the level shifted data latched in the first latch nodes in second latch nodes when a data passing clock is received, and for transmitting data latched in the second latch nodes through output terminals in response to an output enable signal; and a controller for sequentially activating, before the level shifted data are generated, the operations of the sense amplifier and the level shifter by generating a main sensing enable signal and a shifting enable signal as first and second logic levels in response to a sensing enable signal supplied from the device, and for sequentially disabling, immediately after the level shifted data are self-latched, the operations of the sense amplifier and the level shifter by generating the main sensing enable signal and the shifting enable signal as second and first logic levels, thereby causing the data output buffer to be self-reset when the level shifted data are latched in the first latch nodes.

15 Claims, 7 Drawing Sheets

DATA OUTPUT RELATED CIRCUIT WHICH IS SUITABLE FOR SEMICONDUCTOR MEMORY DEVICE FOR HIGH -SPEED OPERATION

This application corresponds to Korean patent application No. 96-76766 filed Dec. 30, 1996 in the name of Samsung Electronics Co., Ltd.

BACKGROUND OF THE INVENTION

1. Field of the Invention

The present invention relates to semiconductor memory devices and, more particularly, to high-speed data output related circuits for synchronous semiconductor memory devices.

2. Description of the Related Art

To reduce the operating cycle time and increase the operating speed of a memory device, data read from a memory cell should be transmitted quickly to an output terminal through a sense amplifier and data output buffer without any signal margin or delay. However, efforts to reduce of the cycle time have been limited by input/output speed differences, power supply voltages, signal margins due to effects such as temperature, separate control of sensing and data latch operations, and the like.

FIGS. 1a and 1b together illustrate a general data output related circuit which includes a read path and a data output scheme for a general synchronous static random access memory device. A main sense amplifier 100 senses data received from memory cells through the read path. A level shifter 20 converts the sensed data to a CMOS level. A data output buffer 30 latches output data from the level shifter 20 and transmits the latched output data to an output terminal. An off-chip driver 400 transmits final data out of the chip. The level shifter 20 converts signals from the level provided from the sense amplifier 100 to a predetermined level, for example, the CMOS level. The level shifter 20, the data output buffer 30 and the off-chip driver 400 are elements commonly utilized in output circuits and other circuits within a semiconductor memory device.

FIG. 2 is a simulation timing chart illustrating the operation of the circuit of FIGS. 1a and 1b. When an enable signal MSAEN for enabling the main sense amplifier 100 is enabled, there occurs a potential difference between the output signals SAS and SASB of the main sense amplifier 100. When an enable signal KDPRECB for enabling the level shifter 20 is enabled to logic "LOW", level shifted data DATAA and DATAAB, which have been precharged to logic "LOW", arc set to logic "HIGH" and "LOW", respectively, as shown by arrow as 1. When a signal KPDATA is enabled by an external clock buffer, the data output buffer 30 transmits the data DATAA and DATAAB to nodes NO3 and NO4 where they are latched as data DATAB and DATABB, respectively. This data latch operation is performed by an inverter latch consisting of inverters 40 and 41 each having an input terminal coupled to the other's output terminal. During the next cycle, when a signal KDATA is applied to the circuit, the data output buffer 30 is enabled. The latched data DATAB and DATABB are transmitted to nodes N05 and N06 where they are latched as data DATAC and DATACB, respectively. The latched data DATAC and DATACB are transmitted to an output terminal I/O through a node NOQ when an output enable signal OE is supplied from an external source such as a microprocessor.

During a data read operation of the data output related circuit of FIGS. 1a and 1b, the sensing operation of the main sense amplifier 100, the level conversion operation of the level shifter 20, and the latch operation for latching the level shifted data in the data output buffer 30 have separate timing, and are controlled by control signals supplied from a clock buffer within the device. This is a disadvantage because the external control signals must be uniformly applied at times that depend on factors such as the input/output speed difference, the power supply voltage, the signal margin which depends on effects such as variations in temperature, variations in pulse widths, etc. These factors make it difficult to reduce the operating cycle time of the memory device because the worst case values of all the factors must be considered when applying the external control signals. Therefore, it is difficult to increase the operating speed of the memory device due to the limitations in reducing the cycle time.

SUMMARY OF THE INVENTION

It is an object of the present invention to provide a data output related circuit which can solve the above-described problems.

It is another object of the present invention to provide a semiconductor memory device which can operate at high-speeds and reduce the number of external control signals.

It is still another object of the present invention to provide a data output related circuit having self latch and self reset functions.

It is a further object of the present invention to provide a data output related circuit which is suitable for a semiconductor memory device which is capable of high-speed operation.

In accordance with one aspect of the present invention, a data output related circuit of a semiconductor memory device includes: a sense amplifier connected to a read path of said device, for generating sensed data; a level shifter for converting a level of said sensed data generated from said sense amplifier and for generating level shifted data; a data output buffer for self-latching said level shifted data in first latch nodes in response to said level shifted data, for latching said level shifted data latched in said first latch nodes in second latch nodes when a data passing clock is received, and for transmitting data latched in said second latch nodes through output terminals in response to an output enable signal; and a controller for sequentially activating, before said level shifted data are generated, operations of said sense amplifier and said level shifter by generating a main sensing enable signal and a shifting enable signal at first and second logic levels in response to a sensing enable signal, and for sequentially disabling, immediately after said level shifted data are self-latched, the operations of said sense amplifier and said level shifter by generating said main sensing enable signal and said shifting enable signal at second and first logic levels, thereby causing said data output buffer to be self-reset when said level shifted data are latched in said first latch nodes, wherein a level conversion operation and a self-reset operation are performed without any external control signal.

BRIEF DESCRIPTION OF THE DRAWINGS

The present invention will be more specifically described with reference to the attached drawings. In the drawings, like reference numerals or symbols designate like elements or signals. In the following description, numerous specific details, such as circuit configurations, components etc., arc set forth to provide a more thorough understanding of the present invention. It will be apparent, however, to one

DETAILED DESCRIPTION

In the present invention, data generated from the memory cells are sensed and level shifted and simultaneously shifted data are automatically latched in a data output buffer. A main sense amplifier and a data output buffer are automatically reset by feedback level shifted data, thereby speeding up the cycle time. That is, in order to speed up the cycle time, sensing and latch operations are performed simultaneously. Further, the main sense amplifier and the level shifter are automatically reset, and the data output buffer self-latches without an external control signal.

Figure 3:
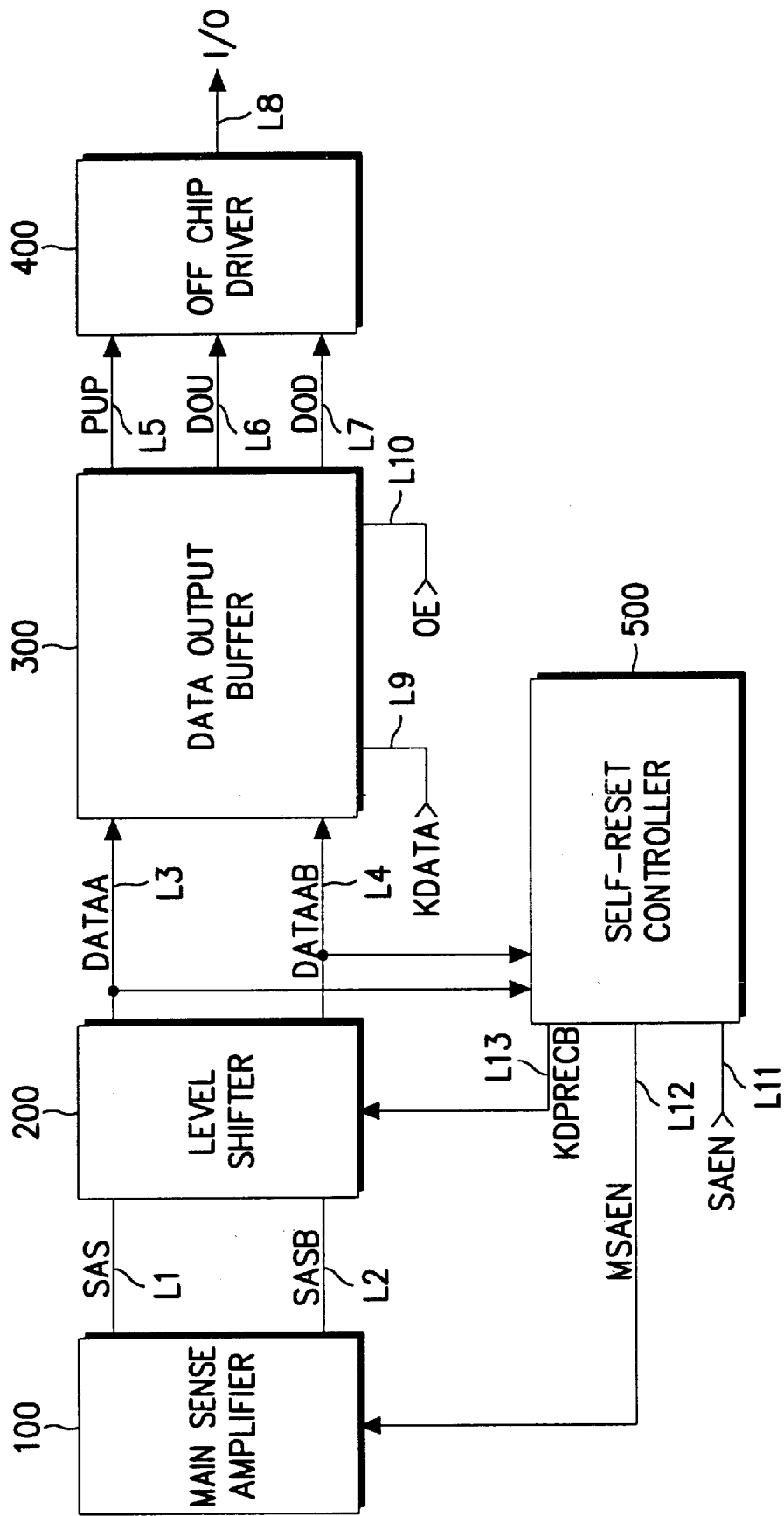
FIG. 3 is a block diagram of an embodiment of a data output related circuit according to the present invention.
Figure 4A:
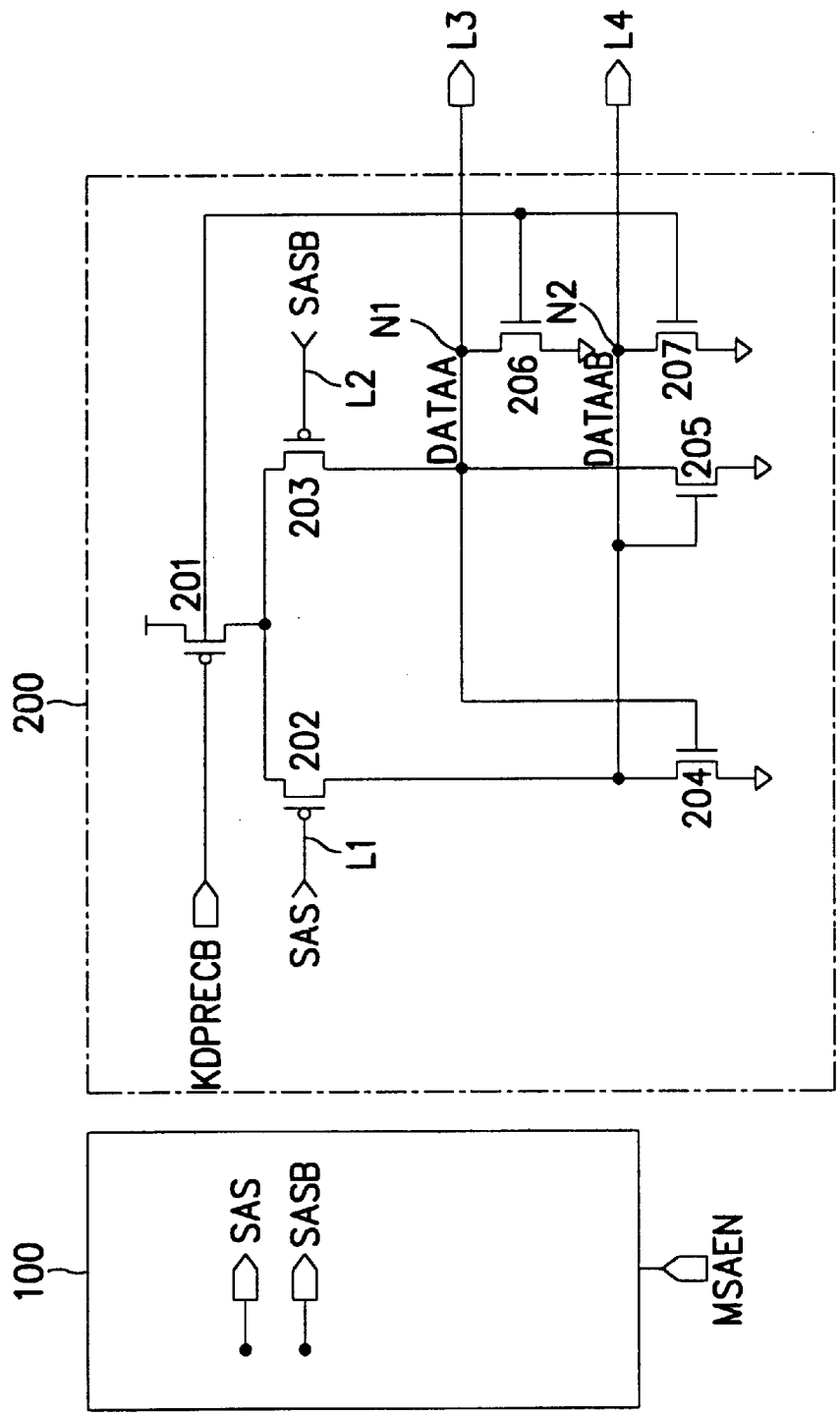
FIGS. 4a and 4b are a circuit diagram showing a detailed embodiment of the circuit of FIG. 3.
Figure 4B:
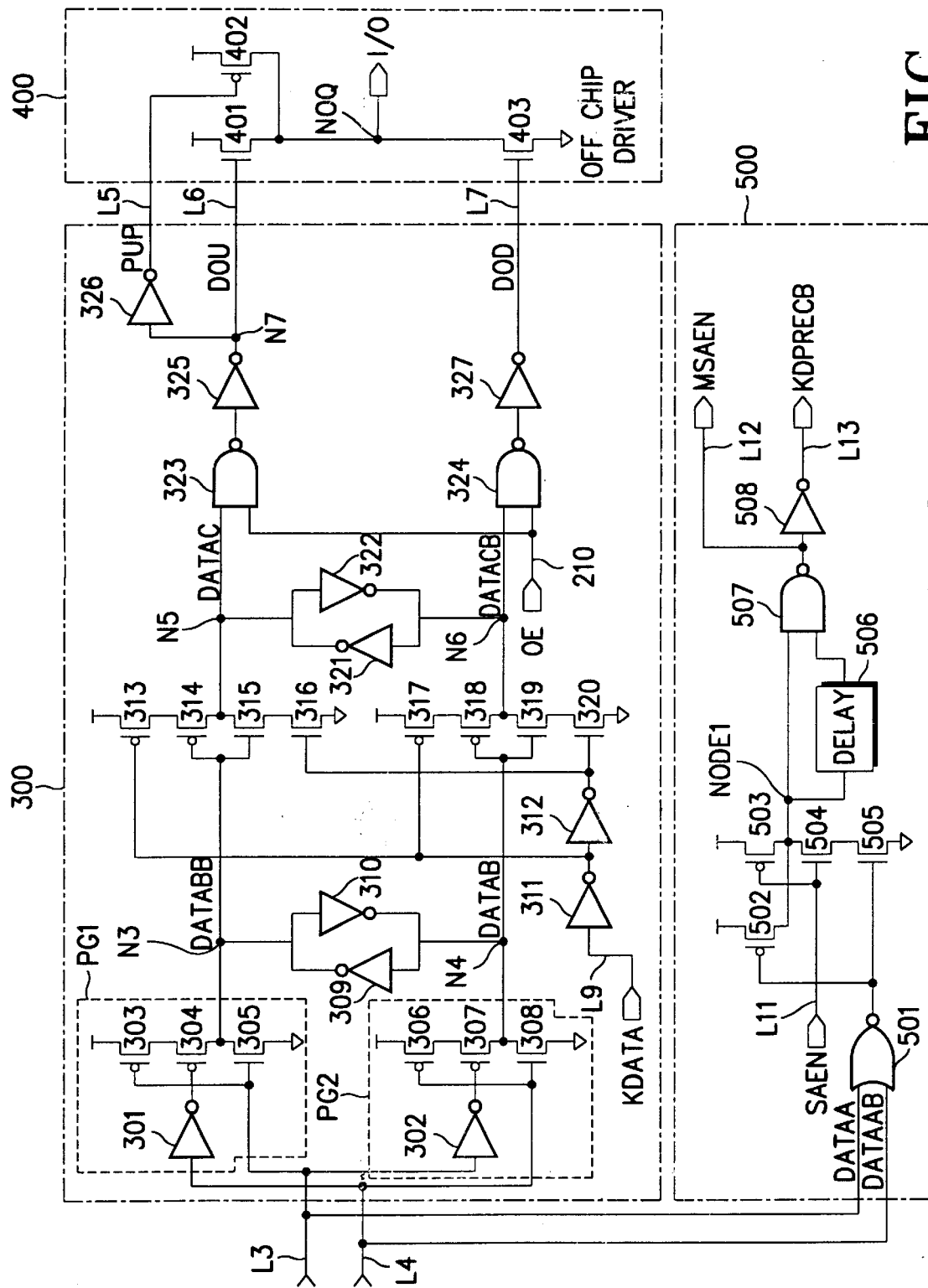
Figure 5:
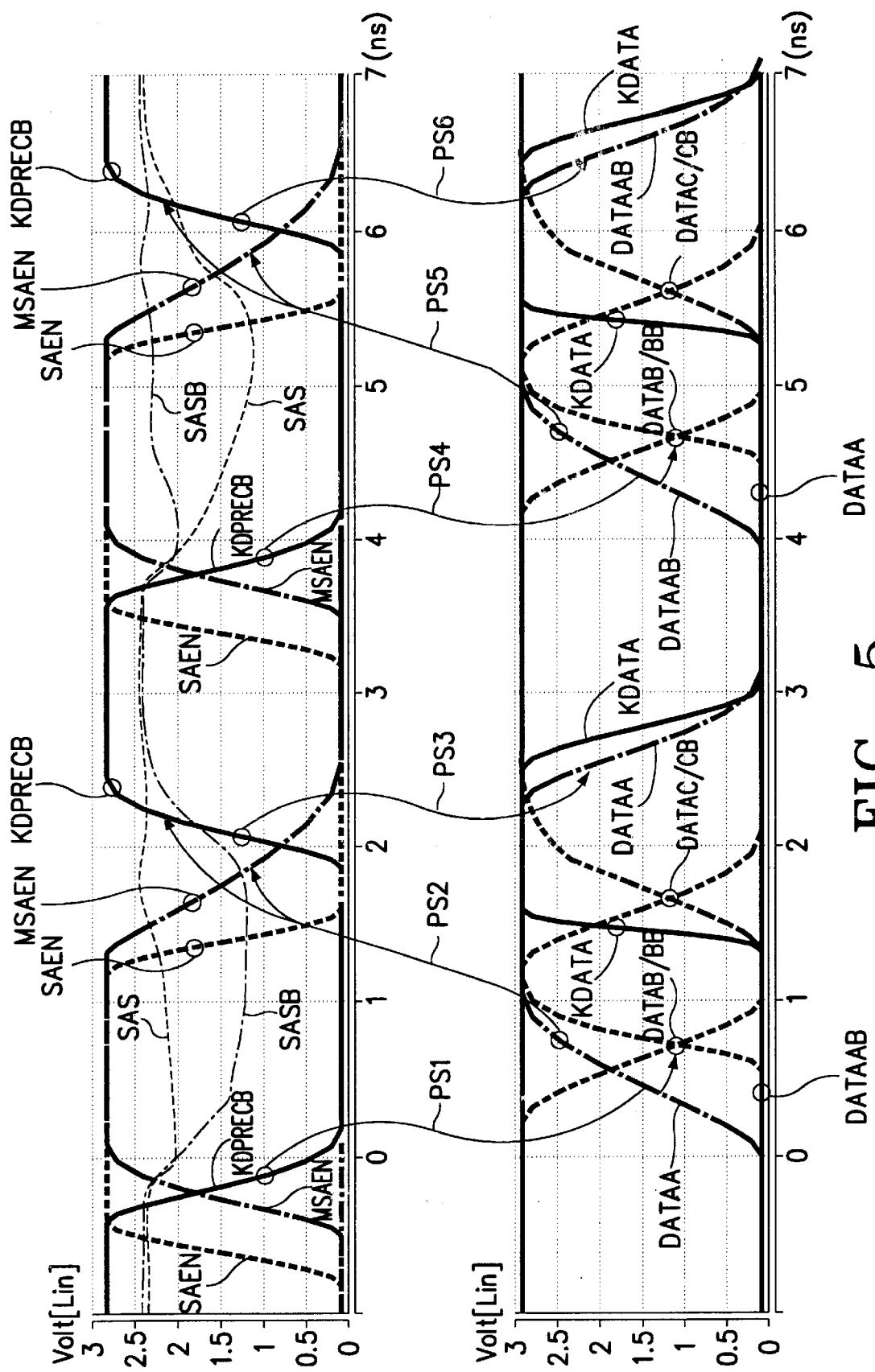
FIG. 5 is a timing chart illustrating the operation of the circuit of FIGS. 4a and 4b.

Referring to FIG. 3, an embodiment of a data output related circuit according to the present invention includes a main sense amplifier 100, a level shifter 200, a data output buffer 300, an off-chip driver 400, and a self-reset controller 500. FIGS. 4a and 4b show a detailed embodiment of the circuit of FIG. 3. FIG. 5 is a timing chart illustrating the operation of the circuit of FIGS. 4a and 4b.

Figure 1A:
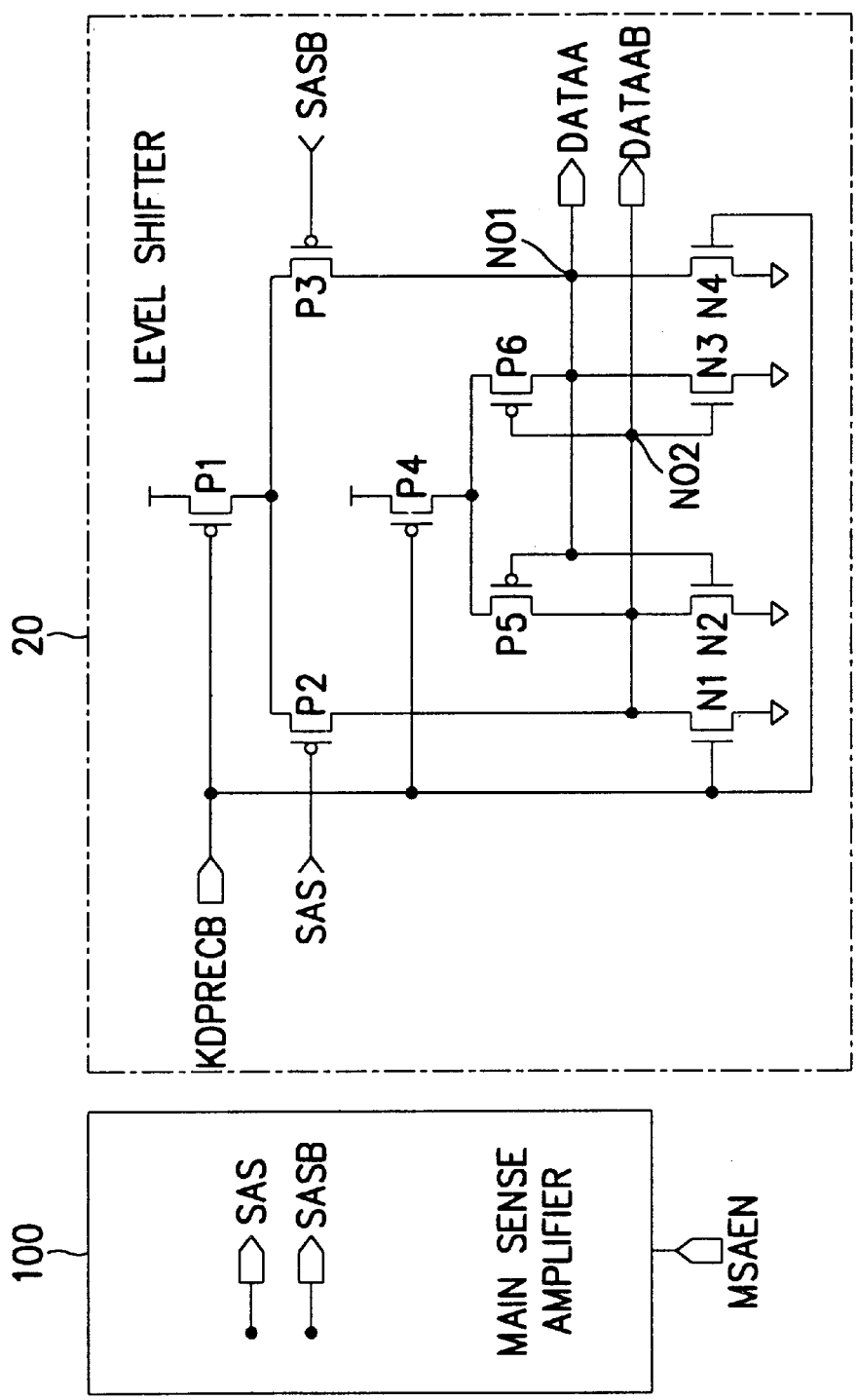
FIGS. 1a and 1b illustrate a general data output related circuit.
Figure 1B:
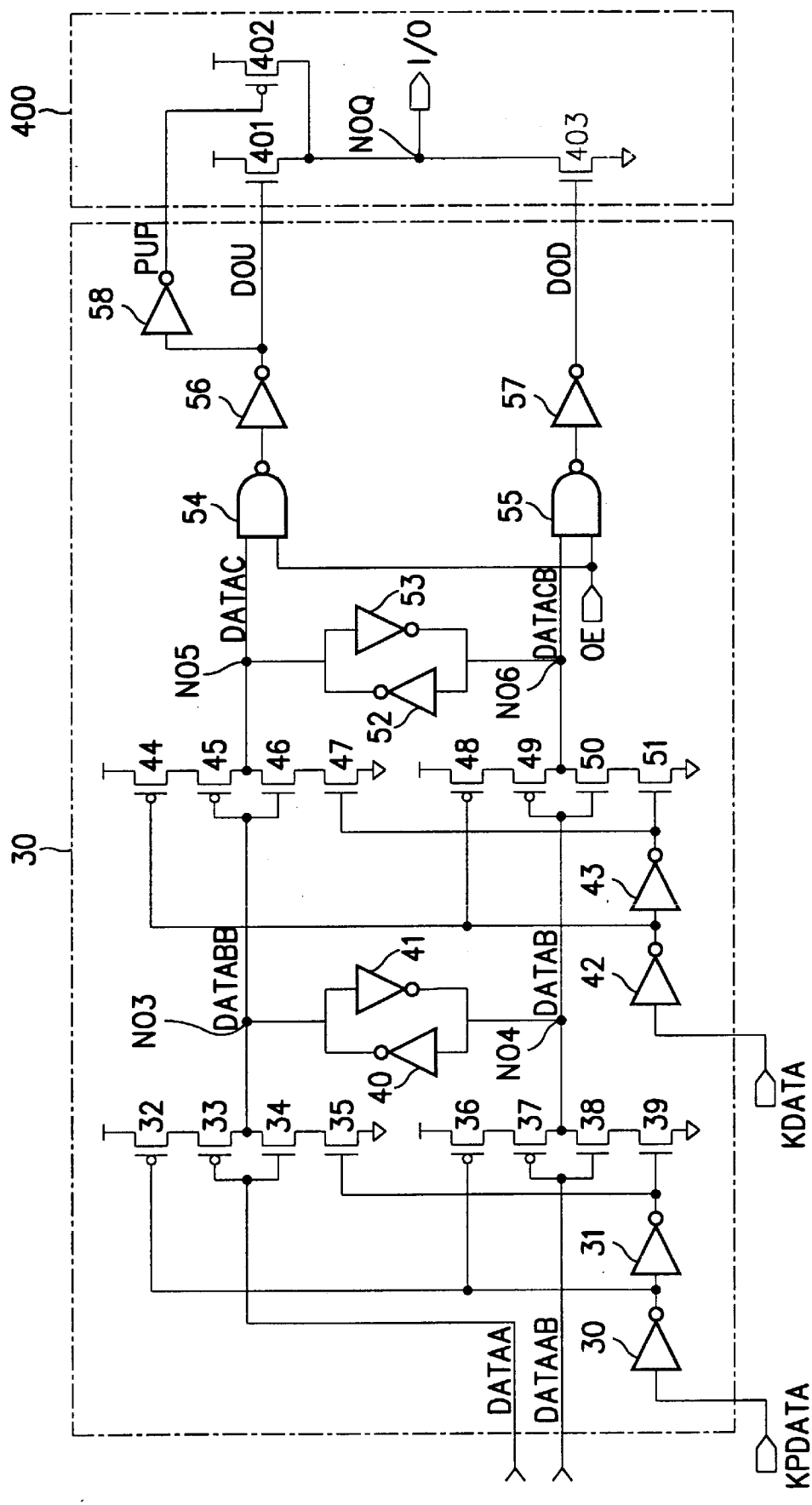
Figure 2:
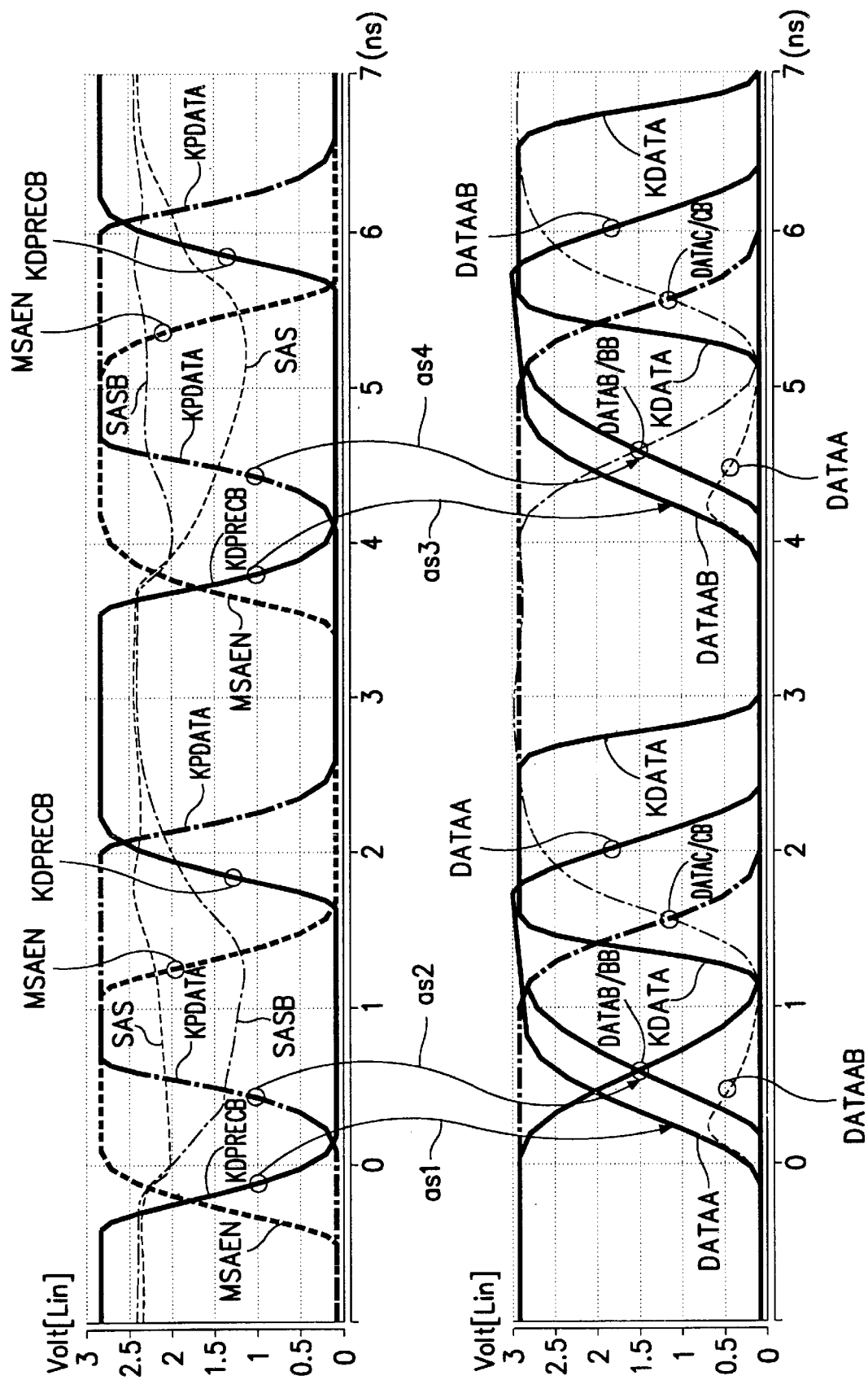
FIG. 2 is an simulation timing chart illustrating the operation of the circuit of FIGS. 1a and 1b.

Referring to FIG. 3, the main sense amplifier 100 for sensing data read from the memory cell has the same internal configuration as the sense amplifier 100 shown in FIG. 1a. However, the main sensing enable signal MSAEN is received through a line L12. The level shifter 200 is enabled when a shifting enable signal KDPRECB received through a line L13 is set to a second level, for example, logic "LOW". The level shifter 200 receives sensed data from the main sense amplifier 100 through lines L1 and L2, and converts the received data to CMOS levels, thereby generating level shifted data. The data output buffer 300 self-latches the level shifted data and transmits the latched data to an internal output terminal. The off-chip driver 400 has the same construction as that shown in FIG. 1b and transmits final data out of the chip.

Before the level shifted data are generated by the level shifter 200, the self-reset controller 500 sets the main sensing enable signal MSAEN and the shifting enable signal KDPRECB to first and second logic levels, for example, to logic "HIGH" and "LOW", respectively, in response to an externally generated sub sensing enable signal SAEN, which can be generated for instance, from a clock buffer within the memory device, thereby sequentially activating the operation of the sense amplifier 100 and the level shifter 200. Consequently, the self-reset controller 500 indirectly controls the self-latch operation of the data output buffer 300. Immediately after the level shifted data are self-latched, the self-reset controller 500 sets the main sensing enable signal MSAEN and the shifting enable signal KDPRECB to second and first logic levels, respectively, for example, logic "LOW" and "HIGH", thereby sequentially disabling the operation the sense amplifier 100 and the level shifter 200. Therefore, the self-reset controller 500 controls the data output buffer 300 so that it self-resets when the level shifted data are latched in first latch nodes N3 and N4.

Referring to FIGS. 4a and 4b, the circuit configurations of embodiments of the level shifter 200, data output buffer 300, off-chip driver 400 and self-reset controller 500 are shown in detail. The level shifter 200 includes a precharge transistor 201, input transistors 202 and 203 for receiving sensing data having complementary levels, output transistors 204 and 205 for generating the level shifted data through their drains, and high-speed discharge transistors 206 and 207 having drains connected to nodes N1 and N2, respectively, and having gates commonly connected to the shifting enable signal KDPRECB.

The data output buffer 300 includes a plurality of elements 301–327. For convenience, the nodes N3 and N4 are called the first nodes, and nodes N5 and N6 are called second nodes. The off-chip driver 400 includes transistors 401, 402 and 403. The self-reset controller 500 includes a gate 501 for generating a NOR response according to logic levels of data DATAA and DATAAB received through lines L3 and L4, P-type and N-type MOS transistors 503 and 504 having gates commonly connected to a line L11, P-type and N-type MOS transistors 502 and 505 having gates commonly connected to the output of the gate 501, a NAND gate 507 having one input connected to a node NODE1 and an output for generating the main sensing enable signal MSAEN through the line L12, a delayer 506 for delaying a signal appearing at the node NODE1 and providing the delayed level to the other input of the NAND gate 507, and an inverter 508 for inverting the output signal from the NAND gate 507 and generating the inverted output through the line L13.

FIG. 5 is a simulation timing chart illustrating the operation of the circuit of FIGS. 4a and 4b. When the externally generated sub sensing enable signal SAEN is set to logic "HIGH", the self-reset controller 500 generates the main sensing enable signal MSAEN for enabling the main sense amplifier 100 and the shifting enable signal KDPRECB for enabling the level shifter 200 as logic "HIGH" and "LOW", respectively. The potential difference between the output data SAS and SASB of the main sense amplifier 100 widens as shown in FIG. 5. The nodes N1 and N2 which have been precharged to logic "LOW" are set to logic "HIGH" and "LOW" which are the same levels of the data DATAA and DATAAB shown in FIG. 5. The level shifted data DATAA and DATAAB, which are set to logic "HIGH" and "LOW", respectively, perform two functions.

First, the level shifted data DATAA and DATAAB turn on one of the transmission gates PG1 and PG2 within the data output buffer 300 to latch themselves in the first nodes N3 and N4. This is a self-latch operation. The latched data appear as data DATAB and DATABB since they pass through the transmission gates PG1 and PG2.

Second, the level shifted data DATAA and DATAAB are applied to the NOR gate 501 within the self-reset controller 500 to generate the signals MSAEN and KDPRECB as logic "LOW" and "HIGH", respectively. Since one of the data DATAA and DATAAB is logic "HIGH", the output of the NOR gate 501 is logic "LOW". A logic "HIGH" level appears at the node NODE1 within the self-reset controller 500. In this case, since the PMOS transistor 503 receiving the sub sensing enable signal SAEN is physically very small, it does not greatly affect the node NODE1 which is set to logic "HIGH". The logic "HIGH" level of the node NODE1 is caused by the turn-on operation of the PMOS transistor 502. The NAND gate 507 receives the logic "HIGH" level of node NODE1 and the logic "HIGH" level generated by the delayer 506, which has an inverter chain consisting of even-numbered inverters, and generates a logic "LOW" through line L12. Meanwhile, the inverter 508 generates a logic "HIGH". Therefore, the signal MSAEN for enabling the main sense amplifier 100 is set to logic "LOW", and the signal KDPRECB for enabling the level shifter 200 is set to logic "HIGH". If the signal KDPRECB is logic "HIGH", the level shifter 200 is disabled, and the nodes N1 and N2 are precharged to logic "LOW". Since the data DATAA and DATAAB are logic "LOW", the transmission gates PG1 and PG2 within the data output buffer 300 are turned off, and the data DATAB and DATABB are maintained at a latched state. In other words, if the signal MSAEN is set to logic "LOW", and the signal KDPRECB is set to logic "HIGH", the main sense amplifier 100 and the level shifter 200 cease operation, and the transmission gates PG1 and PG2 within the data output buffer 300 are cut off. Thus, the level shifted data are latched in the first latch nodes N3 and N4, and the data output buffer 300 is self-reset without depending on the external control signal. This is a self-latch operation.

If the latch and reset operations during one cycle are ended and a data passing clock signal KDATA is enabled during the next cycle, the data DATAB and DATABB latched in the First nodes N3 and N4 are transmitted to the second nodes N5 and N6 to be latched as data DATAC and DATACB. That is, if the data passing clock signal KDATA is received, the data DATAB and DATABB latched in the first latch nodes N3 and N4 are transmitted through transmission gates and latched in the second latch nodes N5 and N6. The data DATAC and DATACB latched in the second nodes N5 and N6 are generated through output terminals DOU and DOD when an output enable signal OE is applied.

Thus, before the level shifted data DATAA and DATAAB are generated, the main sensing enable signal MSAEN and the shifting enable signal KDPRECB are respectively generated as the first and second logic levels in response to the sub sensing enable signal SAEN supplied from the device, thereby sequentially activating the operations of the main sense amplifier 100 and the level shifter 200. Immediately after the level shifted data DATAA and DATAAB are self-latched, the main sensing enable signal MSAEN and the shifting enable signal KDPRECB are respectively generated as the second and first logic levels, thereby sequentially disabling the operations of the main sense amplifier 100 and the level shifter 200. The data output buffer 300 is self-reset when the level shifted data DATAA and DATAAB are latched in the first latch nodes N3 and N4. Hence, the level conversion operation and the self reset operation are performed without any external control signal, and thus the fast cycle time is obtained.

As described above, since faster cycle times are obtained by providing the self-latch function and the self-reset functions, the present invention may be used in a semiconductor memory device operating at high-speeds.

It should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A data output related circuit of a semiconductor memory device, comprising:
   a sense amplifier connected to a read path of said device, for generating sensed data;
   a level shifter for converting a level of said sensed data generated from said sense amplifier and for generating level shifted data;
   a data output buffer for self-latching said level shifted data in first latch nodes in response to said level shifted data, for latching said level shifted data latched in said first latch nodes in second latch nodes when a data passing clock is received, and for transmitting data latched in said second latch nodes through output terminals in response to an output enable signal; and
   a controller for sequentially activating, before said level shifted data are generated, operations of said sense amplifier and said level shifter by generating a main sensing enable signal and a shifting enable signal at first and second logic levels in response to a sensing enable signal, and for sequentially disabling, immediately after said level shifted data are self-latched, the operations of said sense amplifier and said level shifter by generating said main sensing enable signal and said shifting enable signal at second and first logic levels, thereby causing said data output buffer to be self-reset when said level shifted data are latched in said first latch nodes, wherein a level conversion operation and a self-reset operation are performed without any external control signal.

2. A data output related circuit of a synchronous semiconductor memory device, comprising:
   a sense amplifier connected to a read path of said device, for generating sensed data in response to a main sensing enable signal;
   a level shifter for converting a level of said sensed data generated from said sense amplifier in response to a shifting enable signal and for generating level shifted data;
   a data output buffer for self-latching said level shifted data in first latch nodes in response to said level shifted data, for latching said level shifted data latched in said first latch nodes in second latch nodes when a data passing clock is received, and for transmitting data latched in said second latch nodes through output terminals in response to an output enable signal; and
   a controller for sequentially activating, before said level shifted data are generated, operations of said sense amplifier and said level shifter by generating said main sensing enable signal and said shifting enable signal at first and second logic levels in response to a sub sensing enable signal, thereby controlling a self-latch operation of said data output buffer, and for sequentially disabling, immediately after said level shifted data are self-latched, the operations of said sense amplifier and said level shifter by generating said main sensing enable signal and said shifting enable signal at second and first logic levels, thereby controlling said data output buffer so as to be self-reset when said level shifted data are latched in said first latch nodes.

3. A method for generating data of a semiconductor memory device including a sense amplifier, a level shifter and a data output buffer, comprising the steps of:
   sequentially activating operations of said sense amplifier and said level shifter by generating a main sensing enable signal and a shifting enable signal according to a sensing enable signal, and self-latching level shifted data generated from said level shifter in said data output buffer; and
   immediately after said level shifted data are self-latched, sequentially disabling the operations of said sense amplifier and said level shifter to cause said data output buffer to be self-reset when said level shifted data are latched.

4. A data output circuit for a semiconductor memory device comprising:
   a sense amplifier for generating sensed data responsive to a main sensing enable signal;
   a level shifting circuit coupled to the sense amplifier for level shifting the sensed data responsive to a level shifting enable signal, thereby generating level shifted data; and
   a data output buffer coupled to the level shifting circuit for transmitting the level shifted data to an output port responsive to an output enable signal;

wherein the data output buffer self-latches the level shifted data.

5. A data output circuit according to claim 4 further including a controller coupled to the sense amplifier and the level shifting circuit for generating the main sensing enable signal and the level shifting enable signal responsive to a sub sensing enable signal, wherein the controller activates the main sensing enable signal and the level shifting enable signal after the sub sensing enable signal is activated.

6. A data output circuit according to claim 5 wherein:
the controller is coupled to the level shifting circuit to receive the level shifted data;
the level shifted data has a precharge state; and
the controller deactivates the main sensing enable signal and the level shifting enable signal after the level shifted data is no longer in a precharge state.

7. A data output circuit according to claim 6 wherein, after the level shifted data is no longer in a precharge state, the controller delays a length of time before deactivating the main sensing enable signal and the level shifting enable signal.

8. A data output circuit according to claim 4 wherein:
the level shifted data includes a first level shifted signal and a second level shifted signal, the second level shifted signal being the complement of the first level shifted signal;
the first and second level shifted signal have a precharge state;
the level shifting circuit has a first output terminal for transmitting the first level shifted signal and a second output terminal for transmitting the second level shifted signal; and
the data output buffer includes:
a first input terminal coupled to the first output terminal of the level shifting circuit to receive the first level shifted signal,
a second input terminal coupled to the second output terminal of the level shifting circuit to receive the second level shifted signal,
a first transmission gate coupled between the first input terminal and a first node,
a second transmission gate coupled between the second input terminal and a second node, and
a latch coupled between the first and second nodes,
wherein the transmission gates are constructed such that one of the transmission gates turns on when one of the level shifted signal changes from a precharge state, thereby latching the level shifted data at the first and second nodes.

9. A data output circuit according to claim 8 wherein the first transmission gate includes:
an invertor having an input terminal coupled to the first input terminal of the data output buffer, and an output terminal;
a first transistor having a gate coupled to the output terminal of the inverter, and a channel coupled to the first node;
a second transistor having a channel coupled between the channel of the first transistor and a first power supply terminal, and a gate coupled to the second input terminal of the data output buffer; and
a third transistor having a channel coupled between the first node and a second power supply terminal, and a gate coupled to the second input terminal of the data output buffer.

10. A data output circuit according to claim 9 wherein the second transmission gate includes:
a second invertor having an input terminal coupled to the second input terminal of the data output buffer, and an output terminal;
a fourth transistor having a gate coupled to the output terminal of the second inverter, and a channel coupled to the second node;
a fifth transistor having a channel coupled between the channel of the fourth transistor and the first power supply terminal, and a gate coupled to the first input terminal of the data output buffer; and
a sixth transistor having a channel coupled between the second node and the second power supply terminal, and a gate coupled to the first input terminal of the data output buffer.

11. A data output circuit according to claim 7 wherein the controller includes:
a transistor circuit arranged to receive the sub sensing enable signal, wherein the transistor circuit deactivates a node when the sub sensing enable signal is activated;
a NOR gate having two input terminals coupled to receive the level shifted data and an output coupled to the transistor circuit so as to activate the node when the level shifted data is not in a precharge state;
a delay circuit having an input terminal coupled to the node, and an output terminal; and
a NAND gate having a first input terminal coupled to the node, and a second input terminal coupled to the output terminal of the delay circuit.

12. A method for operating a data output circuit for a semiconductor memory device comprising a sense amplifier for generating sensed data responsive to a main sensing enable signal, a level shifting circuit coupled to the sense amplifier for level shifting the sensed data responsive to a level shifting enable signal, thereby generating level shifted data, and a data output buffer coupled to the level shifting circuit for transmitting the level shifted data to an output port responsive to an output enable signal, the method comprising:
activating the main sensing enable signal and the level shifting enable signal responsive to a sub sensing enable signal;
sensing the state of the level shifted data; and
deactivating the main sensing enable signal and the level shifting enable signal when the level shifted data is not in a precharge state.

13. A method according to claim 12 further including delaying deactivating the main sensing enable signal and the level shifting enable signal for a length of time after the level shifted data is not in a precharge state.

14. A method according to claim 12 further including self-latching the level shifted data in the data output buffer.

15. A method according to claim 14 wherein self-latching the level shifted data includes:
sensing the state of the level shifted data; and
turning on a transmission gate in the data output buffer when the level shifted data is not in a precharge state.

* * * * *

UNITED STATES PATENT AND TRADEMARK OFFICE
CERTIFICATE OF CORRECTION

PATENT NO.   : 5,949,721                                      Page 1 of 1
DATED        : September 7, 1999
INVENTOR(S)  : Kwon et al.

It is certified that error appears in the above-identified patent and that said Letters Patent is hereby corrected as shown below:

<u>Title page,</u>
Item [57], ABSTRACT,
Line 16, "arc" should read -- are --.

<u>Column 1,</u>
Lines 60-61, "nodes N05 and N06" should read -- nodes NO5 and NO6 --.

<u>Column 2,</u>
Line 65, "arc" should read -- are --.

<u>Column 5,</u>
Line 16, "the First" should read -- the first --.

Signed and Sealed this

First Day of October, 2002

*Attest:*

*Attesting Officer*

JAMES E. ROGAN
*Director of the United States Patent and Trademark Office*